United States Patent
Kanamaru et al.

(10) Patent No.: US 8,110,066 B2
(45) Date of Patent: Feb. 7, 2012

(54) ADHESIVE COMPOSITION SUITABLE TO BE APPLIED BY SCREEN PRINTING

(75) Inventors: Tatsuya Kanamaru, Karuizawa-machi (JP); Tsuyoshi Honda, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 767 days.

(21) Appl. No.: 12/213,003

(22) Filed: Jun. 12, 2008

(65) Prior Publication Data

US 2008/0308225 A1    Dec. 18, 2008

(30) Foreign Application Priority Data

Jun. 15, 2007    (JP) ................. 2007-158984

(51) Int. Cl.
| | |
|---|---|
| *B65C 9/25* | (2006.01) |
| *C09J 5/00* | (2006.01) |
| *C04B 37/00* | (2006.01) |
| *B60C 1/00* | (2006.01) |
| *C08K 5/24* | (2006.01) |
| *C08G 65/48* | (2006.01) |
| *C08L 51/00* | (2006.01) |

(52) U.S. Cl. ......... 156/325; 156/322; 524/261; 524/540
(58) Field of Classification Search ................. 156/322, 156/325; 524/261, 540
See application file for complete search history.

(56) References Cited

U.S. PATENT DOCUMENTS

| | | | |
|---|---|---|---|
| 6,239,245 B1 * | 5/2001 | Morita et al. ................... | 528/15 |
| 6,383,659 B1 * | 5/2002 | Honda et al. ................... | 428/620 |
| 2006/0194064 A1 * | 8/2006 | Xiao et al. ................... | 428/414 |

FOREIGN PATENT DOCUMENTS

| | | |
|---|---|---|
| JP | 05-226571 A | 9/1993 |
| JP | 2005-060417 A | 3/2005 |

\* cited by examiner

*Primary Examiner* — Philip Tucker
*Assistant Examiner* — Michael Orlando
(74) *Attorney, Agent, or Firm* — Birch, Stewart, Kolasch & Birch, LLP (57) ABSTRACT

An adhesive composition comprising
(A) an epoxy resin,
(B) a curing agent,
(C) a curing promoter,
(D) an inorganic filler,
(E) particles of a thermoplastic resin which is solid at 25° C., and
(F) silicone powder having a particle size at cumulative 50% ($d_{50}$), measured by a laser light diffraction method, of from 1 to 50 μm.

The composition is particularly suitable to be applied by screen printing on a substrate or a silicon wafer.

12 Claims, 1 Drawing Sheet

Fig.1 ns of from 1 to 50 μm, said composition being suitable to be applied by screen printing.

ADHESIVE COMPOSITION SUITABLE TO BE APPLIED BY SCREEN PRINTING

CROSS REFERENCE

This application claims benefit of Japanese Patent application No. 2007-158984 filed on Jun. 15, 2007, the contents of which are hereby incorporated by reference.

FIELD OF THE INVENTION

The present invention relates to an adhesive composition suitable for binding semiconductor elements, specifically to an adhesive composition which comprises silicone powder and is suitable to be applied to a substrate or a silicon wafer by screen printing. The adhesive composition printed on the substrate or the silicon wafer is very stable in a B-stage.

BACKGROUND OF THE INVENTION

Epoxy resins are used for various applications because of its excellent adhesion capability, resistance to heat and moisture. Particularly, liquid epoxy resins are widely used for manufacturing electric devices and electrical appliances. The liquid epoxy resins or compositions primarily composed of the liquid epoxy resins are applied to electric or electrical parts by spin coating, printing or dipping. Among these, printing is most commonly used for the reason that it can easily form various shapes of coating with good productivity.

Compositions for screen printing are known from Japanese Patent Application Laid-Open No. 2005-60417 which discloses an adhesive varnish comprising (A) a polyimide silicone resin, (B) an epoxy resin, (C) an epoxy resin curing agent, (D) inorganic filler, and (E) an organic solvent, and from Japanese Patent Application Laid-Open No. H05-226571 which discloses a composition comprising an epoxy resin, an photopolymerization initiator, a thermoplastic elastomer to provide toughness in B-staged or cured composition, filler to improve thixotropic properties of the composition, and a solvent.

SUMMARY OF THE INVENTION

The aforesaid compositions are suitable for printing in a small area, for example, printing on a lead flame. However, it has been found to be difficult to form a uniform layer of the compositions by wide area printing, for example, coating a whole area of a silicon wafer having a large diameter.

An object of the present invention is therefore to provide a composition which is suitable to be applied by wide area screen printing and forms a coating having smooth surface and uniform thickness. Another object of the present invention is to provide a composition suitable to be applied by screen printing which can be stably stored in a B-stage.

The present invention is an adhesive composition comprising (A) 100 parts by weight of an epoxy resin,
(B) a curing agent in such an amount that an equivalent ratio of an epoxy-reactive group of the curing agent (B) to the epoxy group of the epoxy resin (A) ranges from 0.8 to 1.25,
0.1 to 10 parts by weight, per total 100 parts by weight of the components (A) and (B), of (C) a curing promoter,
10 to 150 parts by weight, per total 100 parts by weight of the components (A) and (B), of (D) an inorganic filler,
5 to 50 parts by weight, per total 100 parts by weight of the components (A) and (B), of (E) particles of a thermoplastic resin which is solid at 25° C., and
10 to 100 parts by weight, per total 100 parts by weight of the components (A) and (B), of (F) silicone powder having a particle size at cumulative 50% ($d_{50}$), measured by a laser light diffraction method, of from 1 to 50 μm, said composition being suitable to be applied by screen printing.

The aforesaid composition has excellent screen printing property: It forms a printed layer which has a uniform thickness of about several tens microns over an area as wide as a surface area of a large-diameter silicon wafer. Since screen printing is a simple and quick process, a process time for manufacturing semiconductor devices can be reduced. The applied composition is stable in a B-stage, that is, a state of a composition with no fluidity, so that it can be stored in the B-stage. This means that no curing proceeds during the storage. This property allows an improved yield of a bonding process of a semiconductor elements.

PREFERRED EMBODIMENT OF THE INVENTION

First, the components of the present composition are explained.

(F) Silicone Powder

The silicone powder may be powder of a silicone elastomer or rubber prepared by crosslinking mostly linear organopolysiloxane as described in Japanese Patent Application Laid-Open No. H03-93834, fine powder of a silicone resin such as polyorganosilsesquioxane described in Japanese Patent Application Laid-Open No. H02-209927, silicone composite powder, i.e., silicone rubber powder coated or deposited with a silicone resin as described in Japanese Patent Application Laid-Open No. H07-196815, or a mixture of these powder. Among these, the silicone composite powder is preferred.

The silicone powder has an average particle size, i.e., particle size at cumulative 50% ($d_{50}$) measured by a laser light diffraction method of from 1 to 50 μm, preferably from 3 to 40 μm. With powder having a $d_{50}$ below the aforesaid lower limit, a surface of a printed layer of the composition tends to be rough and consequently voids tends to be formed between the layer and a semiconductor element bonded to the layer. On the other hand, powder having a $d_{50}$ above the aforesaid upper limit tends to plug a screen. Preferably, the silicone powder has a particle size at cumulative 99% ($d_{99}$) measured by a laser light diffraction method ranging from $\frac{1}{20}$ to $\frac{2}{3}$ of an opening of a screen mesh. The opening is defined according to the following equation:

Opening(μm)=(25400/screen mesh number)−diameter (μm) of a screen wire

Typically, a screen mesh number ranges from 100 to 300, and a diameter of a screen wire ranges from 60 to 20 μm. Accordingly, $d_{99}$ ranges from about 3 to 130 μm. Powder having a $d_{99}$ larger than the aforesaid upper limit tends to plug a screen, whereas powder having a $d_{99}$ smaller than the aforesaid lower limit tends to form a printed layer having a rough surface, so that voids tends to be formed between the layer and a semiconductor element bonded to the layer.

The silicone powder is contained in the composition in an amount of from 10 to 100 parts by weight, preferably from 15 to 60 parts by weight, per total 100 parts by weight of the components (A) and (B). With a composition comprising the silicone powder in an amount less than the aforesaid lower limit, it would be difficult to form an adhesive layer having a uniform thickness by screen printing and there may be voids in a semiconductor device obtained. On the other hand, a composition containing the silicone powder more than the aforesaid upper limit may be too viscous to screen print.

(A) Epoxy Resin

As the epoxy resin (A) in the present invention, a known epoxy resin can be used. Examples of the epoxy resin include novolac type, bisphenol type, biphenyl type, phenolaralkyl type, dicyclopentadiene type, naphthalene type, amino group-containing type, and silicone-modified type epoxy resins, and a mixture of these epoxy resins. Among these, bisphenol-A type, bisphenol-F type, novolac type and silicone-modified type epoxy resins are preferred. The silicone-modified type epoxy resins together with silicone-modified phenolic resins will be explained in the paragraph for (B) curing agent.

(C) Curing Promoter

The curing promoter (C) may be organic phosphorous compounds, imidazols, or tertiary amine compounds. Examples of the organic phosphorous compounds include triphenylphosphine, trubutylphosphine, tri(p-tolyl) phosphine, tri(p-methoxyphenyl)phosphine, tri(p-ethoxyphenyl) phosphine, triphenylphosphine-triphenylborate derivatives, and tetraphenylphosphine-tetraphenylborate derivatives. Examples of imidazol include 2-methylimidazol, 2-ethylimidazol, 2-ethyl-4-methylimidazol, 2-phenylimidazol, 2-phenyl-4-methylimidazol, 2-phenyl-4-methyl-5-hydroxymethylimidazol, and 2-phenyl-4,5-dihyroxymethylimidazol. Examples of tertiary amine include triethylamine, benzyldimethylamine, α-methylbenzyldimethyl amine, and 1,8-diazabicyclo(5,4,0)undecene-7.

Among these, tetraphenylphosphine-tetraphenylborate derivatives represented by the following formula (1), or methyrol imidazol derivatives represented by the following formula (2) are preferred used and, more preferably, used in combination with the phenolic resin or silicone-modified phenolic resin curing agent:

wherein $R^1$ to $R^8$, which may be the same or different, are hydrogen atoms, hydrocarbon groups having 1 to 10 carbon atoms, or halogen atoms;

wherein $R^9$ is a methyl or methylol group, and $R^{10}$ is a hydrocarbon group having 1 to 10 carbon atoms.

The curing promoter(C) is incorporated in the composition preferably in an amount of from 0.1 to 10 parts by weight, particularly 0.2 to 5 parts by weight, per total 100 parts by weight of the epoxy resin (A) and the epoxy resin curing agent (B). With the curing promoter (C) less than the aforesaid lower limit, curing of the composition may be insufficient. If the curing promoter (C) is contained more than the aforesaid upper limit, storage stability of the composition or storage stability of a B-staged composition may be worse.

(D) Inorganic Filler

Examples of the inorganic filler include fused silica, crystallized silica, alumina, titanium oxides, silica titania, boron nitride, aluminum nitride, silicon nitride, magnesia, magnesium silicate, talc, and mica. A mixture of two or more of these can be used. Preferably, at least one selected from silica, alumina and talc is used.

The inorganic filler is incorporated in the composition in an amount of from 10 to 150 parts by weight, preferably from 30 to 100 parts by weight, per total 100 parts by weight of the components (A) and (B).

The inorganic filler preferably has a maximum particle size of at most 20%, particularly at most 10%, of a thickness of applied die bonding agent, which thickness typically ranges from 50 to 200 μm. Preferably, the inorganic filler has an average particle size of at most 10%, particularly 5%, of a thickness of applied die bonding agent. Inorganic filler having a maximum particle size or an average particle size larger than the aforesaid size may damage a silicon chip, substrate, or gold wire, or cause stress at an interface between the inorganic filler and its surrounding, which may impair capability of a semiconductor device. There is no restriction on a lower limit of particle size like the one for the silicone powder as described above.

Surface of the inorganic filler is preferably pretreated with a silane coupling agent. More preferably, the epoxy resin (A) and the surface-treated inorganic filler are premixed at a reduced pressure, whereby the surface of the inorganic filler is thoroughly wet by the epoxy resin, leading to significantly improved moisture resistance.

Examples of the silane coupling agent include γ-glycidoxypropyltrimethoxysilane, γ-glycidoxypropylmethyldiethoxysilane, γ-glycidoxypropyltriethoxysilane, p-styryltrimethoxysilane, γ-methacryloxypropylmethyldimethoxysilane, γ-methacryloxypropyltrimethoxysilane, γ-methacryloxypropylmethyldiethoxysilane, γ-methacryloxypropyltriethoxysilane, γ-acryloxypropyltrimethoxysilane, N-β(aminoethyl)γ-aminopropylmethyldimethoxysilane, N-β(aminoethyl)γ-aminopropyltrhimethoxysilane, N-β(aminoethyl)γ-aminopropyltriethoxysilane, γ-aminopropyltrimethoxysilane, γ-aminopropyltriethoxysilane, N-phenylγ-aminopropyltrimethoxysilane, γ-mercaptopropylmethyldimethoxysilane, γ-mercaptopropyltrimethoxysilane, bis(triethoxypropyyl) tetrasulfide, and γ-isocyanate propyltriethoxysilane. A mixture of two or more of these can be used. Among these, γ-glycidoxypropyltrimethoxysilane is preferred.

(E) Particles of Thermoplastic Resin Solid at 25° C.

Examples of the thermoplastic resin which is solid at 25° C. include AAS resins, AES resins, AS resins, ABS resins, MBS resins, vinyl chloride resins, vinyl acetate resins, (meth) acrylic resins, phenoxy resins, polybutadiene resins, various fluoro-resins, silicone resins, polyacetals, various polyamides, polyamide-imides, polyimides, polyether-imides, polyether ether ketones, polyethylene, polyethylene oxide, polyethylene terephthalate, polycarbonate, polystyrene, polysulfone, polyether sulfone, polyvinyl alcohol, polyvinyl ether, polyvinyl butyral, polyvinyl formal, polyphenylene ether, polyphenylene sulfide, polybutylene terephthalate, polypropylene, and polymethyl pentene.

Among these, (meth)acrylic resins, phenoxy resins, polybutadiene resins, polystyrene and copolymers thereof, particularly (meth)acrylic resins, are preferred. The particle may have a core-shell structure where the core and the shell each consist of different resins. Preferably, the core is a rubber particle composed of a silicone resin, a fluororesin, or a polybutadiene resin, and the shell is composed of a liner thermoplastic resin as those described above.

The thermoplastic resin particles may be spherical or semi-spherical, cylindrical or rectangular cylinder, amorphous, crushed, or flaky. For a die bonding application, preferred are those of spherical or semi-spherical, and amorphous without sharp edges.

An average particle size of the thermoplastic resin particles (C) is preferably selected according to an intended application of the composition. Typically, a maximum particle size, i.e., particle size at cumulative 98% ($d_{98}$), is 10 µm or smaller, preferably 5 µm or smaller, and an average particle size, i.e., median size, ranges from 0.1 to 5 µm, preferably from 0.1 to 2 µm. Particles having a maximum particle size larger than 10 µm or an average particle size larger than the aforesaid upper limit may not be swollen or dissolved, which can impair properties of a cured composition. On the other hand, particles having an average particle size smaller than the aforesaid lower limit may cause increased viscosity of a composition which is difficult to handle. Particle size can be measured with an optical microscope or an electron microscope or by a laser light diffraction method. The aforesaid lower limit of the average particle size is smaller than the aforesaid lower limit for the silicone powder, but it does not impair smoothness of an applied layer of the composition.

The maximum particle size is preferably 20% or smaller, particularly 10% or smaller, of a thickness of the die bonding agent applied on a substrate, and the average particle size is preferably 10% or smaller, more preferably 5% or smaller, of the thickness. Particles having a maximum particle size or an average particle size larger than the aforesaid value may not be swollen or dissolved, which may cause problems such as defects in appearance of a die bonding agent, damages in a chip surface, and electronic leakage.

The thermoplastic resin particles (E) may have a crosslinked structure. However, a degree of the crosslinking is preferably low, because it is desirable that the thermoplastic resin particles are uniformly dispersed in networks formed by the epoxy resin. More preferably, the thermoplastic resin particle is a linear polymer without crosslinkage.

A molecular weight of the thermoplastic resin particles is selected depending on a type of the resin. Typically, a number average molecular weight, reduced to polystyrene, ranges from 1,000 to 10,000,000, preferably from 10,000 to 1,000,000, and a weight average molecular weight, reduced to polystyrene, ranges from 10,000 to 100,000,000, preferably from 100,000 to 1,000,000. A thermoplastic resin having a number or weight average molecular weight lower than the aforesaid lower limit may be swollen at a temperature too low to have desired stability in A-stage, because a composition comprising powder of such a resin is B-staged at an undesirably low temperature. Further, such a composition in B-stage is not hard enough to prevent formation of voids, or shifting or displacement of a silicon die attached on the composition. On the other hand, a thermoplastic resin having a number or weight average molecular weight higher than the aforesaid upper limit may be swollen at a temperature too high or too close to a temperature for C-staging, i.e., total curing, to attain desired stability in B-stage. In addition, a part of such thermoplastic resin particle may hinder formation of a network structure of the epoxy resin during a process of B-staging or C-staging.

In order to attain stable B-stage, the thermoplastic resin particle is contained in the composition in an amount of from 5 to 50 parts by weight, more preferably from 10 to 30 parts by weight, per total 100 parts by weight of the epoxy resin (A) and the curing agent (B). With the component (E) less than the aforesaid lower limit, sufficient hardness of B-staged composition may not be attained. Particularly, when the composition is used as a die bonding agent, problems such as formation of voids or a large fillet, and shifting of a silicon die may be caused. On the other hand, with the component (E) more than the aforesaid upper limit, B-staged composition may be too hard, causing adhesion failure when it is used as a die bonding agent.

(B) Curing Agent

As the curing agent (B), known curing agents can be used such as phenolic resins, after-mentioned silicone modified phenolic reins, acid anhydrides, and amines. Among these, the phenolic resins and silicone modified-phenolic resins are preferred for the reason that a well-balanced curing property and B-stage stability can be attained. Examples of the phenolic resins include novolac type, bisphenol type, trishydroxyphenylmethane type, naphthalene type, cyclopentadiene type, phenolaralkyl type phenolic resins and a mixture thereof, among which novolac type and bisphenol type phenolic resins are preferred.

An example of the silicone-modified resin is a copolymer prepared by reacting an aromatic polymer with an organopolysiloxane. Examples of the aromatic polymers are those represented by the following formulas (3) and (4):

(3)

(4)

wherein $R^{11}$ is a hydrogen atom $R^{12}$ is a hydrogen atom or a methyl group, X is a hydrogen atom or a bromine atom, n is an integer of 0 or greater, preferably of from 0 to 50, particularly from 1 to 20.

Other examples of the aromatic polymers are those having an alkenyl group represented by the following formulas (5) to (8):

(5)

(6)

(7)

(8)

wherein $R^{11}$, $R^{12}$, X and n are as defined above, m is an integer of 0 or larger, preferably of from 0 to 5, particularly 0 or 1.

The aforesaid silicone-modified epoxy resin mentioned as an example of the epoxy resin (A) may be copolymers obtained by reacting an organopolysiloxane with a compound represented by one of the formulas (3) to (8) with $R^{11}$ being the following oxirane group:

The organosiloxane to be reacted with the aforesaid aromatic polymer is represented by the following formula (9):

(9)

wherein $R^{13}$ is a hydrogen atom, an organic group having an amino, epoxy, hydroxyl, or carboxyl group, or an alkoxy group, $R^{14}$ is a substituted or non-substituted monovalent hydrocarbon group, hydroxyl, alkoxy, or alkenyloxy group, a is a number of from 0.001 to 1, and b is a number of from 1 to 3, with a+b ranging from 1 to 4. One molecule of the organosiloxane has 1 to 1,000 silicon atoms and at least one $R^{13}$ bonded to a silicon atom.

Examples of the organic group having an amino group as $R^{13}$ include the following groups, wherein c is 1, 2 or 3.

Examples of the organic group having an epoxy group include the following groups.

Examples of the organic group having a hydroxyl group include the following groups, wherein d is 0, 1, 2, or 3 and e is 1, 2, or 3.

An example of the organic group having a carboxyl group is the following one, wherein f is an integer of from 1 to 10.

Examples of the alkoxy group include those having 1 to 4 carbon atoms such as methoxy, ethoxy, and n-propoxy group.

Preferred examples of $R^{14}$, a substituted or non-substituted monovalent, include monovalent group having 1 to 10 carbon atoms, for example, $C_{1-10}$ alkyl groups such as methyl, ethyl, n-propyl, isopropyl, n-butyl, isobutyl, tert-butyl, pentyl, neopentyl, hexyl, cyclohexyl, octyl, and decyl groups; alkenyl groups such as vinyl, allyl, propenyl, and butenyl groups; aryl groups such as phenyl and tolyl groups; aralkyl groups such as benzyl and phenylethyl groups; and partly or fully halogenated groups thereof.

In the formula (9), "a" and "b" are as defined above, preferably "a" ranges from 0.01 to 0.1 and "b" ranges from 1.8 to 2, with a+b ranging from 1.85 to 2.1. The number of silicon atoms preferably ranges from 2 to 400, particularly 5 to 200. Examples of such organopolysiloxane are those represented by the following formulas (10) and (11):

(10)

-continued (11)

wherein $R^{16}$ corresponds to $R^{13}$ of the formula (9), i.e., a monovalent organic group having an amino, epoxy, hydroxyl, or carboxyl group; $R^{15}$ corresponds to $R^{14}$, i.e., a substituted or non-substituted monovalent hydrocarbon group, preferably methyl or phenyl group; p is an integer of from 0 to 1000, preferably from 3 to 400, and q is an integer of from 0 to 20, preferably from 0 to 5.

Examples of such organopolysiloxane are as shown below.

The organopolysiloxane of the formula (9) preferably has a molecular weight of from 100 to 100,000. Such an organopolysiloxane tends to form a homogeneous molecular structure, where the organopolysiloxane moieties are homogeneously dispersed in an aromatic polymer matrix, or a sea-island structure where an organopolysiloxane phase is separated from a matrix phase, depending on molecular weight and structure of the aromatic polymer to be reacted with the organopolysiloxane.

The organopolysiloxane having a relatively low molecular weight, particularly the one having a molecular weight of from 100 to 10,000, tends to form the homogeneous structure, whereas the one having a relatively high molecular weight, particularly of from 10,000 to 100,000 tends to form the sea-island structure. It is determined depending on an intended use of the composition which structure is to be selected. An organopolysiloxane having a molecular weight smaller than the aforesaid lower limit is not preferred because it tends to give a composition which forms a hard and brittle cured product. The one having a molecular weight larger than the aforesaid upper limit is not preferred either, because it tends to form a coarse see-island structure which may cause local stresses in a cured product.

The reaction between the aromatic polymer and the organopolysiloxane can be performed according to a known method, for example, subjecting the aromatic polymer and the organopolysiloxane to an addition reaction using a platinum catalyst.

In the composition of the present invention, the curing agent (B) is contained in such an amount that an equivalent ratio of an epoxy-reactive group of the curing agent (B) to the epoxy group of the epoxy resin (A) ranges from 0.8 to 1.25, preferably from 0.9 to 1.1. If the mixing ratio is outside the aforesaid range, quality of a cured product and a semiconductor device comprising the cured product may be adversely affected due to unreacted component.

When the component (B) does not comprise the silicone-modified phenolic resin, the component (A) preferably comprises the silicone-modified epoxy resin. That is, at least one of the components (A) and (B) comprises a silicone-modified resin.

In addition to the aforesaid components, the present composition can contain an optional additive in such an amount that it does not adversely affect the composition. Examples of the additives include silane coupling agents, flame retardants, ion trapping agents, wax, colorants, adhesion aids, and diluents.

Examples of the silane coupling agent include γ-glycidoxypropyltrimethoxysilane, γ-glycidoxypropylmethyldiethoxysilane, γ-glycidoxypropyltriethoxysilane, p-styryltrimethoxysilane, γ-methacryloxypropylmethyldimethoxysilane, γ-methacryloxypropyltrimethoxysilane, γ-methacryloxypropylmethyldiethoxysilane, γ-methacryloxypropyltriethoxysilane, γ-acryloxypropyltrimethoxysilane, N-β(aminoethyl)γ-aminopropylmethyldimethoxysilane, N-β(aminoethyl)γ-aminopropyltrimethoxysilane, N-β(aminoethyl)γ-aminopropyltriethoxysilane, γ-aminopropyltrimethoxysilane, γ-aminopropyltriethoxysilane, N-phenylγ-aminopropyltrimethoxysilane, γ-mercaptopropylmethyldimethoxysilane, γ-mercaptopropyltrimethoxysilane, bis(triethoxypropyyl) tetrasulfide, and γ-isocyanate propyltriethoxysilane. A mixture of two or more of these can be used. Among these, γ-glycidoxypropyltrimethoxysilane is preferred.

When the aforesaid coupling agent is used, it is contained in the composition usually in an amount of from 0.1 to 5.0, preferably from 0.3 to 3.0 parts by weight per total 100 parts by weight of the components (A) to (D).

Preparation of the Composition

The present composition can be prepared by mixing the aforesaid components with a mixing means such as a mixer, and a roller mill. Sequence of addition of the component, time, temperature and pressure of mixing can by adjusted as necessary.

The adhesive composition of the present invention is used by a method comprising the following steps of (1) to (4):

(1) applying the adhesive composition on a substrate by screen printing, (2) heating the applied adhesive composition at a temperature of from 60° C. to 200° C. for 3 hours to 1 minute to bring the adhesive composition to a B-stage (3) placing a semiconductor chip on the adhesive composition in the B-stage, and (4) curing the adhesive composition.

Alternatively, the present invention is used by a method comprises the following steps of (i) to (v):

(i) applying the adhesive composition by screen printing on a back side of a silicon wafer to be bonded to a substrate, (ii) heating the applied adhesive composition at a temperature of from 60° C. to 200° C. for 3 hours to 1 minute to bring the adhesive composition to a B-stage, (iii) dicing the silicon wafer and the adhesive composition applied on the back side of the silicon wafer in a plurality of segments, (iv) placing the segment on a substrate or a semiconductor chip via the adhesive composition applied on the back side of the segment, and (v) curing the adhesive composition being in contact with the substrate or the other chip.

In the step (2) or (ii), a batch or continuous type oven can be used to bring the composition to a B-stage, that is, a state where the composition has no fluidity. The heating period is shortened with increase in heating temperature. In the step (iii), a dicer is used. In the step (3) or (iv), a die bonder is used to place a semiconductor chip or a segment on a substrate or another chip via the composition on the back side of the segment. In the step (4) or (v), a batch or continuous type oven can be used to cure the composition.

Dicing

Dicing may be performed with a fast-rotating diamond blade. Alternatively, laser dicing may be employed according to an intended use of a semiconductor device.

Bonding Conditions

The conditions for bonding the chip or a segment include preheating conditions such as preheating temperature and time, and bonding conditions such as temperature of a chip, temperature of a substrate, bonding pressure and time. Preheating is performed in order to improve adhesion between an adhesive composition and a chip. Preheating may be performed at a temperature of from 50° C. to 150° C. for 10 minutes to 2 seconds. In bonding step, a temperature of a chip and substrate may range from 25° C. to 250° C., a bonding time may range from 0.1 sec to 10 seconds, and a bonding pressure may range from 0.01 MPa to 10 MPa.

Curing

Curing is typically performed at a temperature of from 100 to 200° C. for 8 hours to 1 hour. Alternatively, curing may be performed simultaneously with encapsulation of a semiconductor device.

EXAMPLES

Examples 1-3, Comparative Example 1, Referential Examples 1-5

Compositions were prepared by mixing the components in the amounts as shown in Table 1 with a planetary mixer at 25° C. The mixture obtained were passed in a three-roller mill at 25° C. followed by re-mixing with a planetary mixer at 25° C. In Table 1, letters "a" to "i" represent materials as shown below, and numerals represents amounts in parts by weight. In Tables, "Ex." stands for Example, "Comp. Ex." stands for Comparative Example, and "Ref. Ex." stands for Referential Example.

Materials Used (A) Epoxy Resin

Epoxy resin, a: Bisphenol-A type epoxy resin having an epoxy equivalent of 180, sold under the trade name of RE310S from Nihon Kayaku, Co., Ltd.

Silicone-Modified Epoxy Resin, b, Prepared in Preparation Example 1

(B) Curing Agent

Curing agent, h: Phenol novolac resin having an epoxy equivalent of 110 sold under the trade name of DL92 from Meiwa Plastic Industries, Ltd.

Silicone-Modified Curing Agent, i, Prepared in Preparation Example 2

(C) Curing Promoter

Curing promoter, c: Ttetraphenylphosphine-tetraphenylborate sold under the trade name of TPP-K from Hokko Chemical Industry Co., Ltd.

(D) Inorganic Filler

Silica: Spherical fused silica having an average particle size of 0.8 μm, maximum particle size of 3 μm sold under the trade name of SE2030 from Admatechs Co., Ltd.

(E) Thermoplastic Resin Particles

Thermoplastic resin particles, d: Poly(methyl methacrylate) having a number average molecular weight of 50,000, a weight average molecular weight of 150,000, an average particle size of 1 μm and a maximum particle size of 3 μm.

(F) Silicone Powder

Silicone powder, e, having $d_{50}$ of 0.8 μm, and $d_{99}$ of 2 μm, X-52-7030, ex Shin-Etsu Chemical Co. Ltd.)

Silicone powder, f, having $d_{50}$ of 12 μm, and $d_{99}$ of 25 μm, KMP-601, ex Shin-Etsu Chemical Co. Ltd.)

Silicone powder, g, having $d_{50}$ of 30 μm, and $d_{99}$ of 60 μm, KMP-602, ex Shin-Etsu Chemical Co. Ltd.)

Synthesis of Silicone-Modified Resins

Preparation Example 1

In a flask equipped with a stirring blade, a dropping funnel, a thermometer, an ester adapter and a reflux condenser, 42.0 g (0.10 mole) of the epoxy resin of the formula (12) shown below and 168.0 g of toluene were placed and subjected to azeotropic dehydration at 130° C. for 2 hours. After cooling the mixture of the epoxy resin and toluene to 100° C., 0.5 g of a catalyst, CAT-PL-50T, ex Shin-Etsu Chemical Co., Ltd, was added dropwise to the mixture. Immediately after the completion of the addition, a mixture of 36.3 g (0.05 mole) of the organopolysiloxane of the formula (15) shown below and 145.2 g of toluene was added dropwise in about 30 minutes and then heated at 100° C. for 6 hours. By removing toluene, transparent yellowish liquid, hereinafter referred to as silicone-modified epoxy resin, was obtained which had a viscosity of 5 Pa·s at 25° C., an epoxy equivalent of 400 and an organopolysiloxane content of 46.4 parts by weight.

Preparation Example 2

In a flask equipped with a stirring blade, a dropping funnel, a thermometer, an ester adapter and a reflux condenser, 30.8 g (0.10 mole) of the phenolic resin of the formula (13) shown below and 123.2 g of toluene were placed and subjected to azeotropic dehydration at 130° C. for 2 hours. After cooling the mixture of the phenolic resin and toluene to 100° C., 0.5 g of a catalyst, CAT-PL-50T, ex Shin-Etsu Chemical Co., Ltd, was added dropwise to the mixture. Immediately after the completion of the addition, a mixture of 36.3 g (0.05 mole) of the organopolysiloxane of the formula (15) shown below and 145.2 g of toluene was added dropwise in about 30 minutes and then heated at 100° C. for 6 hours. By removing toluene, transparent brownish liquid, hereinafter referred to as silicone-modified curing agent, was obtained which had a viscosity of 20 Pa·s at 25° C., a phenolic equivalent of 340 and an organopolysiloxane content of 54.1 parts by weight.

(12)

(13)

(14)

Test Methods (a) Viscosity

Viscosity of a composition was measured with an E-type viscometer, HBDV-III, ex Brookfield Co., at a temperature of 25° C. and a shear rate of 2.00 sec$^{-1}$ according to the Japanese Industrial Standard Z-8803. Measurement was made 2 minutes after starting rotation of the plate. The present composition preferably has a viscosity of from 100 to 500 Pa·s at 25° C.

(b) Screen Printing on a Silicon Wafer

Each composition prepared was printed on a silicon wafer, which is 6 in. in diameter and 0.3 mm in thickness, through a 200 mesh screen having a 150 mmΦ—circle pattern made of wires having a diameter of 40 μm. The printing was performed with a gap, between the screen and the wafer, of 1 mm at a printing pressure of 10 psi to form a 30 μm to 60 μm thick layer of the composition.

The layer of the composition thus formed was B-staged by heating at 120° C. for 20 minutes under nitrogen flow. A thickness of the B-staged layer of the composition was measured by a thickness meter and a degree of flatness was calculated according to the following equation:

A degree of flatness=a maximum thickness of the layer (μm)/a minimum thickness of the layer (μm).

A composition with a degree of flatness of 1.2 or smaller was rated as "Good (G)" and the one with a degree of flatness larger than 1.2 was rated as "No Good (N.G.)"

The layer of the composition was visually observed for voids. Compositions showing no void were rated as "Good" and those showing at least one void or crater were rated as "No Good."

(c) Screen Printing on a Silicon Wafer

Each composition was printed on a 35 mm×35 mm×200 μm BT substrate having a 30 μm thick solder resist coated thereon through a 200 mesh screen having a 7 mm×7 mm square pattern made of wires having a diameter of 40 μm. The printing was performed with a gap, between the screen and the substrate, of 1 mm at a printing pressure of 10 psi to form a 30 μm to 60 μm thick layer of the composition.

The layer of the composition thus formed was B-staged by heating at 120° C. for 20 minutes under nitrogen flow. A thickness of the B-staged layer of the composition was measured by a thickness meter and a degree of flatness was calculated according to the following equation:

A degree of flatness=a maximum thickness of the layer (μm)/a minimum thickness of the layer (μm).

A composition with the flatness of 1.1 or smaller was rated as "Good" and the one with the thickness ratio larger than 1.1 was rated as "No Good."

The layer of the composition was visually observed for voids. Compositions showing no void were rated as "Good" and those showing at least one void or crater were rated as "N.G."

(d) Stability in B-Stage

Ten milligrams of a composition was B-staged by heating the composition at 120° C. for 20 minutes. Immediately, the B-stage composition was analyzed by differential scanning calorimeter, ex Mettler, by heating the composition in an aluminum cell or pan and an empty aluminum cell as a reference at a temperature rise rate of 10° C./min from 25° C. to 300° C. in air. The B-stage composition stored at 25° C. for predetermined periods of time shown in the Table 1 was analyzed in the same manner as above and a ratio of an exothermic peak area of the stored composition to that of the composition analyzed immediately after it was B-staged was calculated.

(e) Voids after Bonding a Chip

Figure 1:
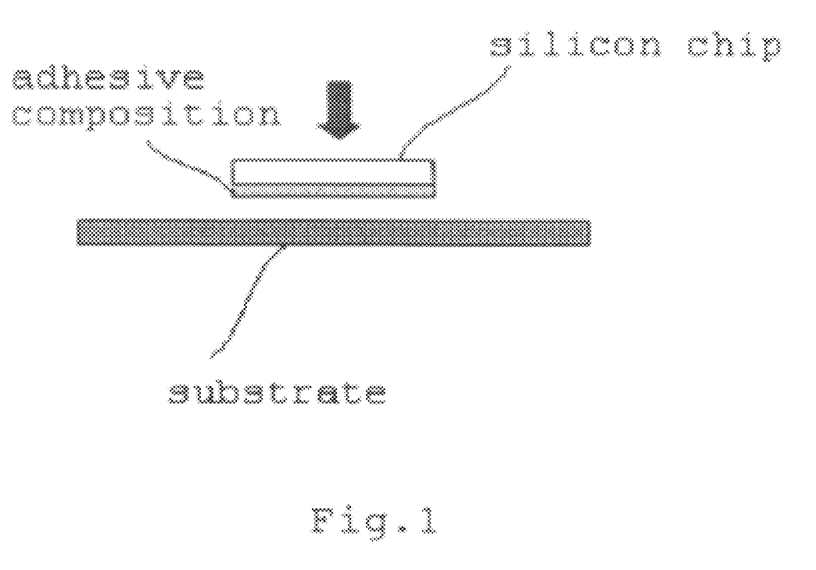
FIG. 1 is a cross sectional view of a semiconductor device prepared in the present Example.

A test piece as shown in FIG. 1 was prepared. Total 20 pieces were prepared and observed by Scanning Acoustic Tomograph (SAT). Test pieces in which a void was detected were counted.

The test piece was prepared by the following method:

The silicon wafer with a composition layer printed thereon in the aforesaid test (b) was fixed on a dicer via a die bonding tape, T-80MW, Toyo Adtec Co., Ltd., and diced in a plurality of 7 mm×7 mm chips. One chip was picked up and bonded on a 35 mm×35 mm×200 μm BT substrate having a 30 μm thick solder resist coated thereon via the composition layer in the following bonding conditions: Chip temperature of 150° C., substrate temperature of 100° C., at a bonding pressure of 1 MPa for a boning period of 1 second. Then, the composition layer was heated at 150° C. for 2 hours into C-stage.

(f) Voids after Bonding a Chip

A test piece as shown in FIG. 1 was prepared. Total 20 pieces were prepared and observed by Scanning Acoustic Tomograph (SAT). Test pieces in which a void was detected were counted.

The test piece was prepared by the following method:

On the substrate with a composition layer printed thereon in the aforesaid test (c), a 7 mm×7 mm silicon chip was bonded in the following bonding conditions: Chip temperature of 150° C., substrate temperature of 100° C., at a bonding pressure of 1 MPa for a boning period of 1 second. Then, the composition layer was heated at 150° C. for 2 hours into C-stage.

INDUSTRIAL APPLICABILITY

The composition of the present invention can be screen printed in a uniform thickness on a silicon wafer having large diameter. This allows simplification and cost reduction of manufacturing semiconductor devices. Moreover, the applied composition can be stored in B-stage, so that productivity of the semiconductor devices can be increased.

The invention claimed is:

1. A method of using an adhesive composition, said method comprising the steps of
   (1) applying the adhesive composition on a substrate by screen printing,
   (2) heating the applied adhesive composition at a temperature of from 60° C. to 200° C. for 3 hours to 1 minute to bring the adhesive composition to a B-stage,
   (3) placing a semiconductor chip on the adhesive composition, and
   (4) curing the adhesive composition,
   wherein the adhesive composition comprises
      (A) 100 parts by weight of an epoxy resin,
      (B) a curing agent in such an amount that an equivalent ratio of an epoxy-reactive group of the curing agent (B) to the epoxy group of the epoxy resin (A) ranges from 0.8 to 1.25,
      0.1 to 10 parts by weight, per total 100 parts by weight of the components (A) and (B), of (C) a curing promoter,
      10 to 150 parts by weight, per total 100 parts by weight of the components (A) and (B), of (D) an inorganic filler,
      5 to 50 parts by weight, per total 100 parts by weight of the components (A) and (B), of (E) particles of a thermoplastic resin which is solid at 25° C., and
      10 to 100 parts by weight, per total 100 parts by weight of the components (A) and (B), of (F) silicone powder having a particle size at cumulative 50% ($d_{50}$), measured by a laser light diffraction method, of from 1 to 50 μm,

TABLE 1

| | | Ex. 1 | Ex. 2 | Ex. 3 | Ref. Ex. 1 | Ref. Ex. 2 | Ref. Ex. 3 | Ref. Ex. 4 | Ref. Ex. 5 | Comp. Ex. 1 |
|---|---|---|---|---|---|---|---|---|---|---|
| (A)Epoxy resin | a | 34.6 | | 34.6 | 34.6 | 34.6 | | 34.6 | 34.6 | 34.6 |
| | b | | 78.4 | | | | 78.4 | | | |
| (B)Curing agent | h | | 21.6 | | | | 21.6 | | | |
| | i | 65.4 | | 65.4 | 65.4 | 65.4 | | 65.4 | 65.4 | 65.4 |
| (C)Curing promoter | c | 1 | 1 | 1 | 1 | 1 | 1 | 1 | 1 | 1 |
| (D)Inorganic filler | | 65.4 | 34.3 | 71.8 | 65.4 | 34.3 | 65.4 | 58.1 | 65.4 | 65.4 |
| (E)Thermoplastic resin particle | d | 20 | 20 | 20 | 20 | 20 | 20 | 3 | 20 | 20 |
| (F)Silicone powder | e | | | | 30 | | | | | |
| | f | 30 | 15 | 45 | | 15 | 30 | 30 | | |
| | g | | | | | | | | 30 | |
| (a)Viscosity | Pa·s | 260 | 380 | 430 | 330 | 80 | 570 | 190 | 240 | 150 |
| (b)Screen printing on a silicon wafer | Flatness | G | G | G | N.G. | G | N.G. | G | — | N.G. |
| | Voids | G | G | G | G | N.G. | G | G | — | N.G. |
| (c)Screen printing on a substrate | Flatness | G | G | G | G | G | N.G. | G | — | N.G. |
| | Voids | G | G | G | G | N.G. | G | G | — | N.G. |
| (d)B-stage storage stability | 4 weeks, % | 97.5 | 99 | 98.5 | 98.4 | 98.8 | 97.5 | 97.8 | — | 97.1 |
| | 8 weeks, % | 97.2 | 97.7 | 98 | 98 | 98.1 | 96.5 | 94.2 | — | 96.1 |
| | 16 weeks, % | 95.9 | 96.4 | 96.2 | 96.6 | 97.4 | 95.9 | 86 | — | 95.9 |
| | 24 weeks, % | 95.3 | 96.1 | 95.3 | 95.5 | 96.6 | 95.8 | 72.2 | — | 95.7 |
| (e)Voids after bonding a chip | | 0/20 | 0/20 | 0/20 | 5/20 | 18/20 | 8/20 | 0/20 | — | 13/20 |
| (f)Voids after bonding a chip | | 0/20 | 0/20 | 0/20 | 0/20 | 18/20 | 6/20 | 0/20 | — | 16/20 |

As shown in Table 1, the compositions of Examples are printed uniformly to cause no void after a silicone chip is bonded. The compositions, even after they were stored in B-stage for a predetermined period of time, showed 95% or more of exothermic heat of curing, indicating no progression of the curing during storage.

A printed layer of the composition of Referential Example 1 had a worse surface smoothness due to smaller $d_{50}$ of the silicone powder. On the other hand, the composition of Referential Example 5 could not be printed because the screen was plugged with silicone powder having a large $d_{99}$, so that the tests other than viscosity could not be performed.

The composition of Referential Example 4 contained component (E) too little to be stabile in B-stage.

The compositions of Referential Examples 2 and 3 did not have viscosity suited for printing. The viscosity, however, can be adjusted within the range of mixing ratios of the components specified in the present invention.

wherein the amounts of the inorganic filler (D) and the silicone powder (F) are such that the composition has a viscosity, measured with an E-type viscometer, of from 100 to 500 Pa·s at 25° C.

2. A method of using an adhesive composition, comprising the steps of
(i) applying the adhesive composition by screen printing on a back side of a silicon wafer to be bonded to a substrate,
(ii) heating the applied adhesive composition at a temperature of from 60° C. to 200° C. for 3 hours to 1 minute to bring the adhesive composition to a B-stage,
(iii) dicing the silicon wafer and the adhesive composition applied on the back side thereof in a plurality of segments,
(iv) placing the segment on a substrate or a semiconductor chip via the adhesive composition applied on the back side of the segment, and
(v) curing the adhesive composition being in contact with the substrate or the other chip,
wherein the adhesive composition comprises
(A) 100 parts by weight of an epoxy resin,
(B) a curing agent in such an amount that an equivalent ratio of an epoxy-reactive group of the curing agent (B) to the epoxy group of the epoxy resin (A) ranges from 0.8 to 1.25,
0.1 to 10 parts by weight, per total 100 parts by weight of the components (A) and (B), of (C) a curing promoter,
10 to 150 parts by weight, per total 100 parts by weight of the components (A) and (B), of (D) an inorganic filler,
5 to 50 parts by weight, per total 100 parts by weight of the components (A) and (B), of (E) particles of a thermoplastic resin which is solid at 25° C., and
10 to 100 parts by weight, per total 100 parts by weight of the components (A) and (B), of (F) silicone powder having a particle size at cumulative 50% ($d_{50}$), measured by a laser light diffraction method, of from 1 to 50 μm,
wherein the amounts of the inorganic filler (D) and the silicone powder (F) are such that the composition has a viscosity, measured with an E-type viscometer, of from 100 to 500 Pa·s at 25° C.

3. The method of using the adhesive composition according to claim 1, wherein the silicone powder (F) has a particle size at cumulative 99% ($d_{99}$), measured by the laser light diffraction method, of two thirds or smaller of an opening of a screen mesh, which opening is defined by the following equation:

opening (μm)=(25400/screen mesh number)−diameter (μm) of a screen wire wherein the screen mesh number ranges from 100 to 300 and the diameter of the screen wire ranges from 60 to 20 μm.

4. The method of using the adhesive composition according to claim 1, wherein the silicone powder (F) is selected from the group consisting of silicone rubber powder, silicone resin powder and silicone composite powder wherein silicone rubber powder is coated with a silicone resin.

5. The method of using the adhesive composition according to claim 1, wherein the particles of thermoplastic resin which is solid at 25° C. (E) are particles of a thermoplastic resin selected from the group consisting of methacrylic resins, phenoxy resins, polybutadiene resins, polystyrene resins and copolymer resins of these polymers.

6. The method of using the adhesive composition according to claim 1, wherein the particles of thermoplastic resin which is solid at 25° C. (E) has a number average molecular weight, reduced to polystyrene, of from 10,000 to 100,000, and a weight average molecular weight, reduced to polystyrene, of from 100,000 to 1,000,000.

7. The method of using the adhesive composition according to claim 1, wherein at least one of the components (A) and (B) comprises a silicone-modified resin.

8. The method of using the adhesive composition according to claim 2, wherein the silicone powder (F) has a particle size at cumulative 99% ($d_{99}$), measured by the laser light diffraction method, of two thirds or smaller of an opening of a screen mesh, which opening is defined by the following equation:

opening (μm)=(25400/screen mesh number)−diameter (μm) of a screen wire wherein the screen mesh number ranges from 100 to 300 and the diameter of the screen wire ranges from 60 to 20 μm.

9. The method of using the adhesive composition according to claim 2, wherein the silicone powder (F) is selected from the group consisting of silicone rubber powder, silicone resin powder and silicone composite powder wherein silicone rubber powder is coated with a silicone resin.

10. The method of using the adhesive composition according to claim 2, wherein the particles of thermoplastic resin which is solid at 25° C. (E) are particles of a thermoplastic resin selected from the group consisting of methacrylic resins, phenoxy resins, polybutadiene resins, polystyrene resins and copolymer resins of these polymers.

11. The method of using the adhesive composition according to claim 9, wherein the particles of thermoplastic resin which is solid at 25° C. (E) has a number average molecular weight, reduced to polystyrene, of from 10,000 to 100,000, and a weight average molecular weight, reduced to polystyrene, of from 100,000 to 1,000,000.

12. The method of using the adhesive composition according to claim 2, wherein at least one of the components (A) and (B) comprises a silicone-modified resin.

* * * * *